US012785430B2

(12) United States Patent
Carey et al.

(10) Patent No.: US 12,785,430 B2
(45) Date of Patent: Nov. 3, 2026

(54) ENERGY PROFILER USE WITH BATTERY-POWERED LOAD DEVICE

(71) Applicant: Silicon Laboratories Inc., Austin, TX (US)

(72) Inventors: Eugenio Carey, Austin, TX (US); Franco Maggi, Asker (NO)

(73) Assignee: Silicon Laboratories Inc., Austin, TX (US)

( * ) Notice: Subject to any disclaimer, the term of this patent is extended or adjusted under 35 U.S.C. 154(b) by 323 days.

(21) Appl. No.: 18/543,601

(22) Filed: Dec. 18, 2023

(65) Prior Publication Data

US 2025/0202257 A1 Jun. 19, 2025

(51) Int. Cl.
*H02J 7/00* (2026.01)
*H05K 1/18* (2026.01)

(52) U.S. Cl.
CPC ................ *H02J 7/855* (2026.01); *H05K 1/18* (2013.01); *H05K 2201/10037* (2013.01); *H05K 2201/10053* (2013.01); *H05K 2201/10128* (2013.01); *H05K 2201/10151* (2013.01)

(58) Field of Classification Search
CPC . H02J 7/855; H05K 1/18; H05K 2201/10037; H05K 2201/10151
See application file for complete search history.

(56) References Cited

U.S. PATENT DOCUMENTS

2014/0244191 A1* 8/2014 Oka ..................... G01R 21/133 702/61
2018/0136706 A1* 5/2018 Wiencke ............. G06F 11/3062
2023/0081639 A1* 3/2023 Maggi ...................... G05F 1/575

OTHER PUBLICATIONS

Silicon Laboratories Inc., "UG429: EFR32xG21 2.4 GHz 10 dBm Radio Board User's Guide," Rev. 2.0, Sep. 2022, 40 pages.
Joulescope, "The Most Affordable and Easy-to-Use Precision Energy Analyzer, Now Even Better," 2023 Jetperch LLC, downloaded from www.joulescope.com on Aug. 29, 2023, 12 pages.

* cited by examiner

*Primary Examiner* — Nathan Milakovich
(74) *Attorney, Agent, or Firm* — Zagorin Cave LLP

(57) ABSTRACT

Techniques for observing energy consumption of a target device using battery power in a target application are described. These techniques use a development board and associated development software to sense voltage and current for computation of actual power and energy consumption and battery life during product development. The techniques provide application developers with information useful for developing software that reduces microcontroller current and power consumption to extend battery-life of a target device in a target application, which reduces battery waste and reduces expenses associated with servicing a product including the target device. The techniques enable an integrated development environment that does not need expensive, external equipment to measure the power consumption of the target device when powered by a battery or other power source.

20 Claims, 6 Drawing Sheets

ENERGY PROFILER USE WITH BATTERY-POWERED LOAD DEVICE

BACKGROUND

Field of the Invention

This disclosure is related to integrated circuits and more specifically to the development of products using integrated circuits.

Description of the Related Art

In general, engineers use development tools to design and test applications of integrated circuits in new products. For example, a typical development toolkit for wireless applications, e.g., Internet of Things (IoT) applications, includes hardware and software for configuring a target device and debugging software or firmware executing on the target device. The development toolkit includes a development board having a footprint for electrically and mechanically coupling to a target device under development. The footprint may provide electrical and communications interfaces directly to a target device held by the development board or indirectly to the target device via a separate printed circuit board that hosts the target device. An exemplary target device includes a System-on-a-Chip (SoC) having a radio frequency transceiver circuit, a simple, ultra low power microcontroller, and analog or digital peripherals. Separate printed circuit boards that are compatible with development hardware have the same footprint and couple to the development board at the same location but may include different components and different target devices for different products. The development board communicates with a host computing system (e.g., a laptop) using a conventional interface (e.g., USB interface). Software executing on the host computing system is available for configuration of the target device, downloading application code (e.g., firmware) to the target device, and debugging execution of the application software by the target device.

A conventional development system requires use of expensive stand-alone energy analyzers or lab bench instruments that measure current and voltage and compute power and energy consumption for analysis and provides little or no information regarding correlation of software events or execution steps with power consumption. Other conventional development systems include conventional energy profiler tools that execute software on a host computing system of a development toolkit and display energy consumption of the target device when powered based on a DC voltage received from a conventional interface (e.g., 5 V power supplied by USB connection). A conventional energy profiler integrated in a development kit improves correlation of software events or execution steps with power consumption as compared to energy profilers using external battery simulators or external current meters. The voltage provided to the target device by the development kit is a regulated DC voltage, i.e., a voltage provided by a low-dropout regulator or other voltage regulator that is interposed between a conventional power interface (e.g., USB) and the target device. However, the target device may be intended for a low power wireless application that sources energy from a battery (e.g., a coin cell battery that has a nominal voltage of 3 V) having performance characteristics that are different from the characteristics of a DC power supply. For example, a battery powered supply voltage signal includes variations (i.e., disturbances) due to ripple currents flowing through the equivalent series resistance (ESR) of the battery. Those variations are not considered when using a regulated voltage derived from a conventional power interface. Determining the power consumption of the target device when operating under conditions in a target application (e.g., battery-powered) is useful for determining battery life associated with a product including the target device and to determine how the target device behaves in response to the State Of Charge (SOC). The battery ESR and cell voltage vary and deviate from nominal values according to the SOC. Conventional development kits that use regulated voltages typically do not consider those variations in ESR and voltage. Accordingly, improved techniques for monitoring energy consumption of an integrated circuit device under development are desired.

SUMMARY OF EMBODIMENTS OF THE INVENTION

In at least one embodiment, a method for developing a battery-powered integrated circuit product using a development system includes providing power to a load device from a battery using a first conductive node coupled to a first power supply terminal of the load device and a second conductive node coupled to a second power supply terminal of the load device. The method includes providing an indicator of power consumption of the load device while the power is being provided to the load device using a voltage across the first power supply terminal and the second power supply terminal equal to a voltage equivalent to a battery voltage of the battery coupled to a third conductive node and a fourth conductive node. Providing the indicator may include providing a bias voltage to the fourth conductive node and regulating a first voltage on the first conductive node according to the indicator and the bias voltage. The providing may include compensating for a voltage drop resulting from sensing the power consumption of the load device by regulating a voltage on the fourth conductive node based on the indicator.

In at least one embodiment, a development system includes a printed circuit board having a sensing circuit coupled to a first conductive node, a second conductive node, a third conductive node, and a fourth conductive node. The sensing circuit is configured to provide an indication of power consumed by a target device. The first conductive node is configured as a positive power supply terminal for the load device and the second conductive node is configured as a negative power supply terminal for the load device. The first conductive node and the second conductive node are configured to provide power to the load device from a battery. A voltage across the first conductive node and the second conductive node is equal to a voltage equivalent to a battery voltage of the battery. The sensing circuit may include a resistor having a first resistance, a first terminal, and a second terminal. The resistor may be coupled between the first conductive node and the third conductive node. The sensing circuit may further include an amplifier circuit having a non-inverting terminal coupled to the first terminal and an inverting terminal coupled to the second terminal.

In at least one embodiment, a development system includes a circuit configured to provide power sourced from a battery to a load device. The circuit is configured to provide an indication of a level of the power sourced from the battery to the load device using a voltage across the load device equal to a voltage equivalent to a battery voltage of the battery. The circuit may include a sensing element and an amplifier circuit. The sensing element may have a first resistance and may be coupled to a first battery terminal of the battery and a first load terminal of the load device. The amplifier circuit may have a non-inverting terminal coupled to a first sensing terminal of the sensing element and an inverting terminal coupled to a second sensing terminal of the sensing element. The circuit may include an additional resistor and a voltage regulator circuit. The additional resistor may have a second resistance coupled to a second battery terminal of the battery and a second load terminal of the load device. The second resistance may be equal to the first resistance. The voltage regulator circuit may be coupled to the second battery terminal of the battery and the second load terminal of the load device. The voltage regulator circuit and the additional resistor may be coupled in parallel. An output of the amplifier circuit may control the voltage regulator circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Techniques for measuring energy consumption of a load device configured to source power from a battery in a target application are described. The techniques use a development board including sensing circuitry that compensates for a voltage drop caused by the sensing circuitry, thereby causing application of the battery voltage or a voltage equivalent to the battery voltage to the load device. The techniques provide application developers with information useful for developing software that reduces power consumption and extends battery life of the load device in a target application. Extension of battery life of the load device in the target application reduces waste and expenses associated with replacing batteries during the lifetime of the load device in the target application.

Figure 1:
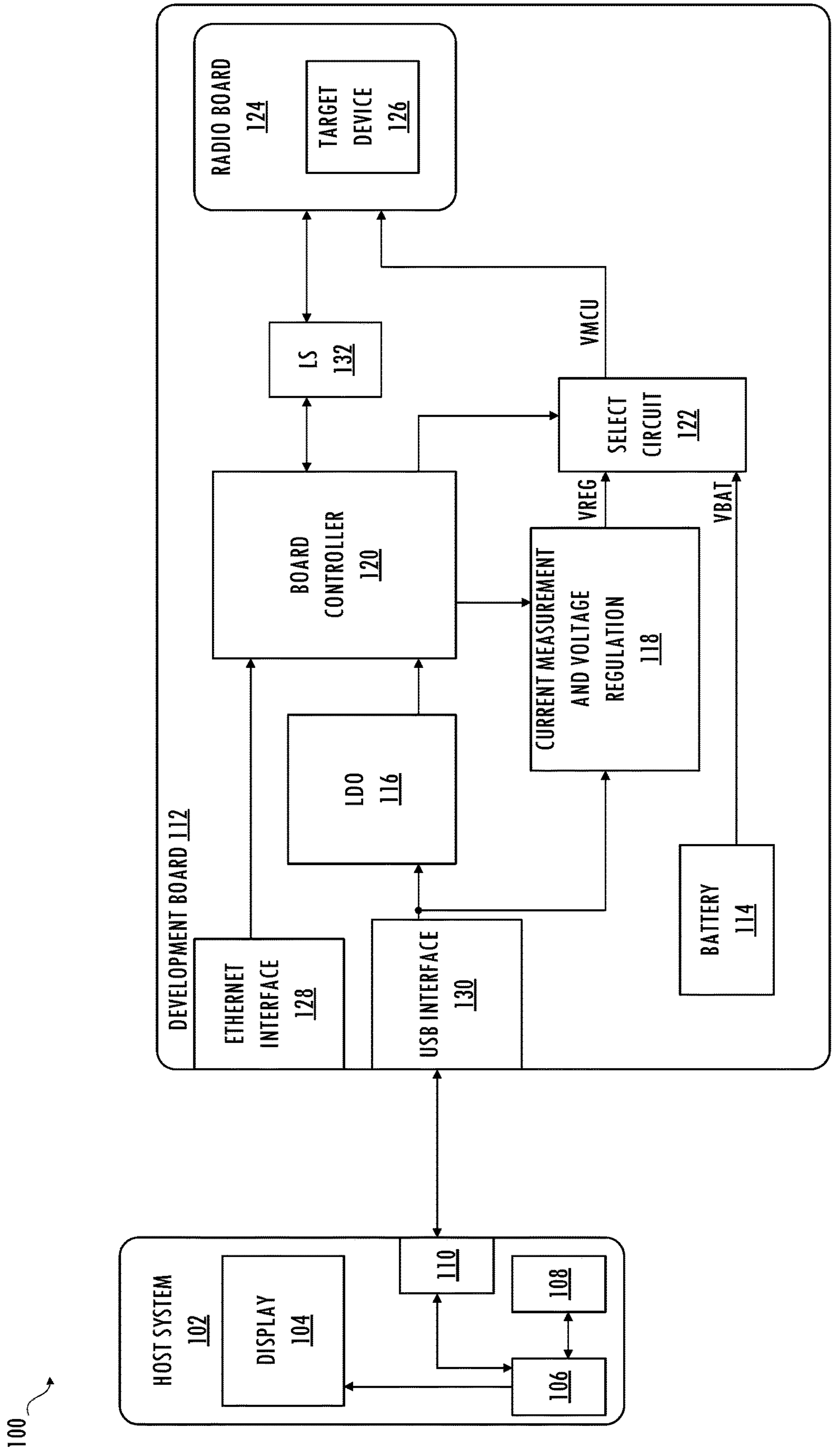
FIG. 1 illustrates a functional block diagram of an exemplary development system for integrated circuit applications.

Referring to FIG. 1, an exemplary system for developing integrated circuit products includes host system 102, which may include processor 106 that executes instructions stored in memory 108, USB interface 110, and display 104. Development system 100 includes development board 112, which provides conductive landing patterns and electrical connections for Ethernet interface 128, Universal Serial Bus (USB) interface 130, battery 114, low dropout regulator 116, current measurement and voltage regulation circuit 118, board controller 120, level shifters 132, select circuit 122, and radio board 124. Radio board 124 holds target device 126 (i.e., the load device) and associated analog and digital peripherals and provides electrical connections therebetween. However, in other embodiments of development board 112, radio board 124 is excluded and target device 126 and any associated analog and digital peripherals are held by development board 112 and directly connected to traces on development board 112. In an embodiment, USB interface 130 couples development board 112 directly to host system 102. In other embodiments, Ethernet interface 128 is used to communicate with a host system using a local area network. In an embodiment of development board 112, low dropout regulator 116 provides a stable supply voltage to board controller 120 and other circuitry on development board 112 based on power (e.g., 5 V) received using the USB interface 130. In an embodiment of development board 112, level shifters 132 isolate the power domains of board controller 120 and target device 126 to allow true measurements of current consumption of target device 126. In an embodiment, host system 102 configures development board 112 by communicating configuration information between host system 102 and development board 112 using USB interface 130 or Ethernet interface 128.

In an embodiment, board controller 120 writes configuration information and firmware to target device 126 to configure target device 126 for a target application. In an embodiment, a user manually configures select circuit 122 to select between a power supply voltage regulated based on a DC power supply voltage provided by USB interface 130 or a voltage provided by battery 114. In other embodiments, board controller 120 configures select circuit 122 to select between a power supply voltage regulated based on a DC power supply voltage or a voltage provided by battery 114. In an embodiment of development system 100, board controller 120 programs current measurement and voltage regulation circuit 118 to change voltage $V_{REG}$ to a constant level in a predetermined range (e.g., 1.8 V-3.6 V) for powering target device 126 when select circuit 122 provides voltage $V_{REG}$ as voltage $V_{MCU}$. When select circuit 122 is configured to provide power from battery 114 to target device 126, the power supplied to other circuits of development board 112 is unaffected. In at least one embodiment, board controller 120 executes firmware for use in debugging target device 126.

Development board 112 includes a printed circuit board having lands, i.e., conductive pads or conductive patterns to which components are attached, or other conductive structure to receive terminals of devices and a radio board, which holds a target device for development and associated circuitry, and couples those terminals to traces on the printed circuit board. In an embodiment, radio board 124 includes target device 126 that supports one or more wireless protocols (e.g., Bluetooth®, Matter, Zigbee, Thread, etc.) and is configured for an IoT application. Therefore, firmware executing on target device 126 should have very low-power operation (e.g., operation with an average current in a micro-Ampere range), which would allow target device 126 to operate using only power received from a coin cell battery for a substantial amount of time (e.g., years, in some applications).

In an exemplary application, target device 126 is configured as a door sensor in a burglar alarm and is powered by a coin cell battery. Development board 112 is used to develop firmware for target device 126 that causes target device 126 to have long battery life in the burglar alarm application, requiring infrequent or no maintenance. Therefore, target device 126 should be evaluated when sourcing power from the coin cell battery to determine battery life in that application and under each mode of operation associated with that application since different modes may consume different levels of operating current.

Figure 2:
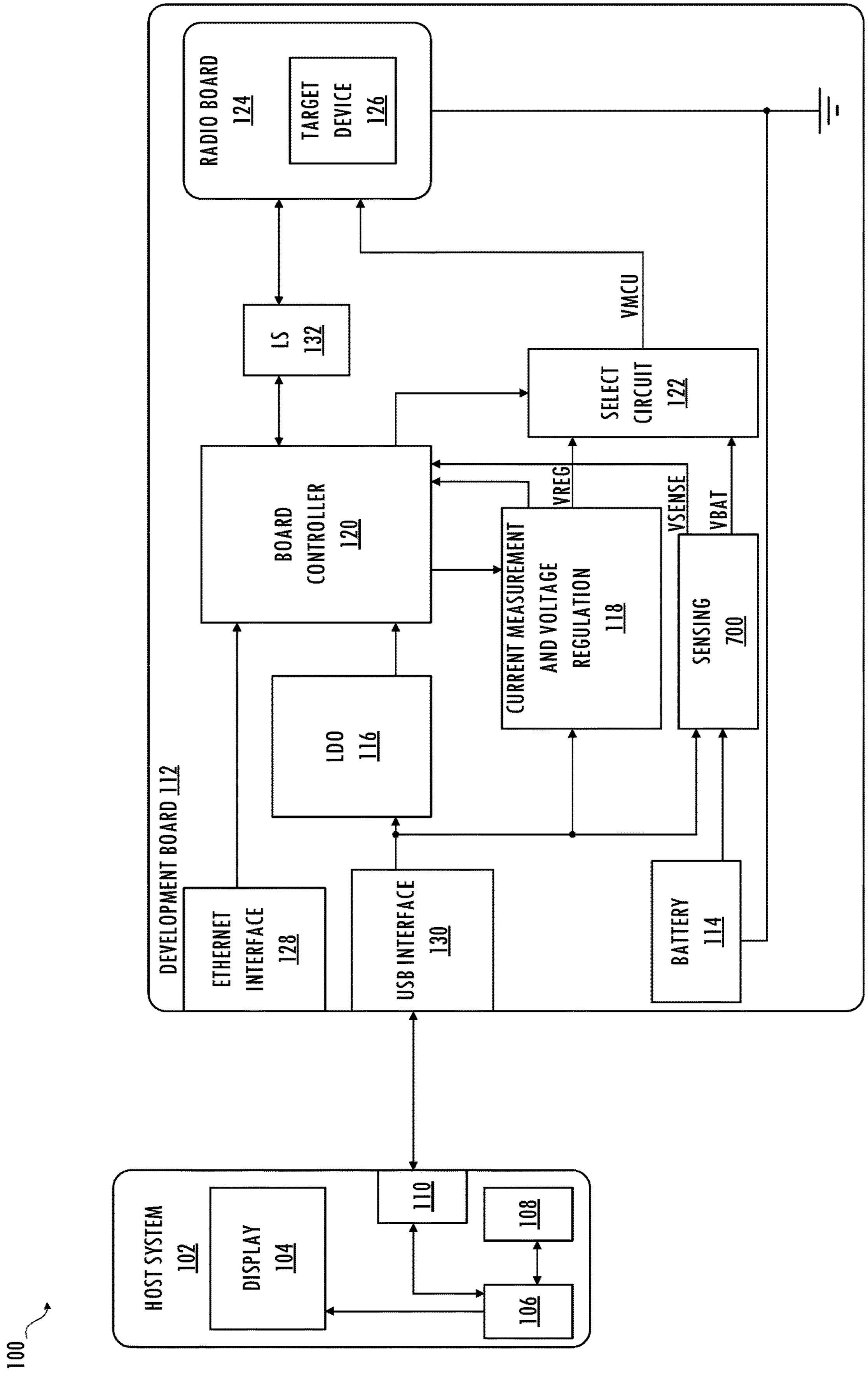
FIG. 2 illustrates a functional block diagram of an exemplary development system including a sensing circuit for integrated circuit applications.

Referring to FIG. 2, in an embodiment of development system 110, current measurement and voltage regulation circuit 118 regulates (e.g., using a low dropout regulator) the 5 V voltage received from the USB interface and when selected, power select circuit 122 provides voltage $V_{REG}$ as voltage $V_{MCU}$ to target device 126 via radio board 124. In addition, current measurement and voltage regulation circuit 118 senses the current drawn by target device 126 via radio board 124 using one or more sense resistors, a current sense amplifier, one or more gain stages, and a signal processing circuit that converts the sensed signal to a digital value that is provided to board controller 120, which, in some embodiments, automatically selects appropriate sense elements from multiple sense elements on the development board. Sensing circuit 700 provides battery voltage $V_{BAT}$, which select circuit 122 provides to radio board 124 when configured for battery power. In addition, sensing circuit 700 senses the current drawn by target device 126 via radio board 124 using one or more sense resistors, a current sense amplifier, and provides sensed current signal $V_{SENSE}$ to board controller 120 for analog-to-digital conversion and use in system measurement by host system 102. In an embodiment of development system 100, board controller 120 performs signal processing before host system 102 reads the digital current sense signal at a predetermined sample rate (e.g., 100 kHz) for display or storage. In an embodiment of development system 100, board controller 120 averages that data to achieve sufficient accuracy, e.g., for low current applications. Energy profiler software executing on host system 102 captures indicators of energy consumed by target device 126 and provides power consumption information using well-known relationships (e.g., P=I×V). For example, board controller 120 receives direct measurements of current and voltage and computes an instantaneous power measurement. In an embodiment, board controller 120 further integrates the instantaneous power measurement over a time interval to determine energy consumption for the time interval. In an embodiment of development system 110, the board controller keeps track of instructions executed and corresponding times of execution, which can be used to correlate instruction execution with instantaneous power consumption. In an embodiment of development system 100, the energy profiler software displays average current usage of radio board 124.

Figure 3:
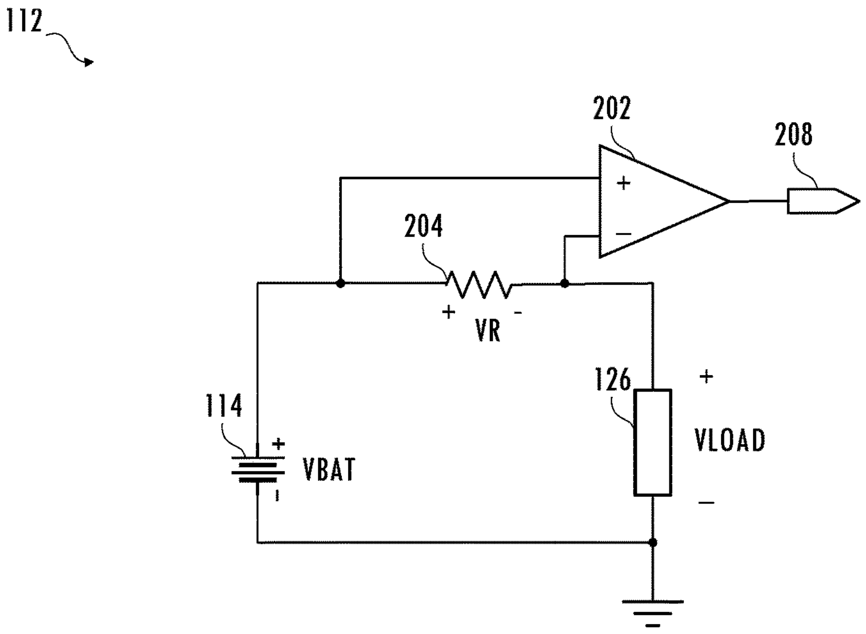
FIG. 3 illustrates a circuit diagram of exemplary portions of a development board including conventional sensing circuitry for use in measuring power consumption of a battery-powered target device.

Referring to FIG. 3, a technique for sensing current sourced from a battery when selected as the power supply for target device 126 includes coupling battery 114 to ground and sourcing current into target device 126, which is configured as a load. Amplifier 202 senses the current sourced from battery 114 and provides the sensed values to node 208, which is coupled to an input of a board controller or other circuitry for analog-to-digital conversion and further use in system measurement. In at least one embodiment, a processing circuit converts analog signals to digital values and provides those digital values to board controller 120. In the configuration of FIG. 3, load voltage $V_{LOAD}$ across target device 126 does not have the same level as the voltage of battery 114 and is reduced by the voltage drop across sense resistor 204. Accordingly, the conditions of operating target device 126 in the configuration of FIG. 3 are not identical to the conditions of target device 126 in the target application, which may result in inaccurate estimates of battery life or may cause the target application to halt if the voltage drop falls below a minimum operational voltage specified for the target device.

Figure 4:
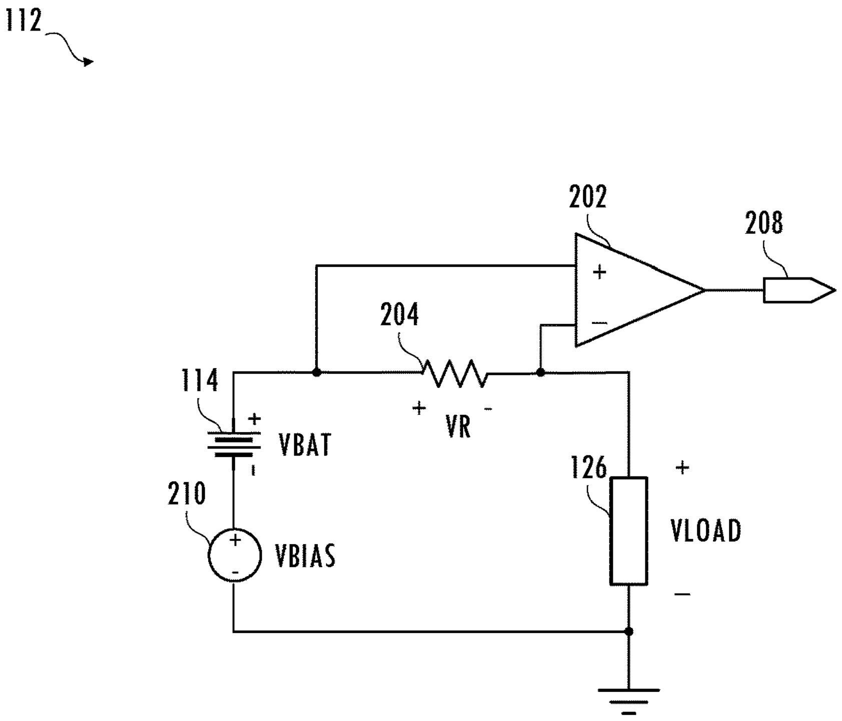
FIG. 4 illustrates a circuit diagram of exemplary portions of a development board including sensing circuitry having a bias circuit for use in measuring power consumption of a battery-powered target device.

In FIG. 4, a technique for sensing current sourced from a battery when the battery selected as the power supply for target device 126 includes coupling bias voltage source 210 in series with the negative terminal of battery 114 to introduce a fixed bias voltage. Bias voltage $V_{BIAS}$ has a predetermined voltage that is selected to ensure that target device 126 is sufficiently powered and not damaged under different load conditions. Bias voltage source 210 modifies load voltage $V_{LOAD}$ (i.e., voltage across the target device 126) as follows: $V_{LOAD}=V_{BAT}-V_R+V_{BIAS}$. When bias voltage $V_{BIAS}$ equals voltage $V_R$, load voltage $V_{LOAD}$ equals battery voltage $V_{BAT}$. However, in practice, battery voltage $V_{BAT}$ falls within a range of voltages and a predetermined bias voltage provided by a fixed bias voltage source may be mismatched to the actual battery voltage, thus resulting in power measurements that do not represent actual conditions in practice and inaccurate battery life estimates.

Figure 5:
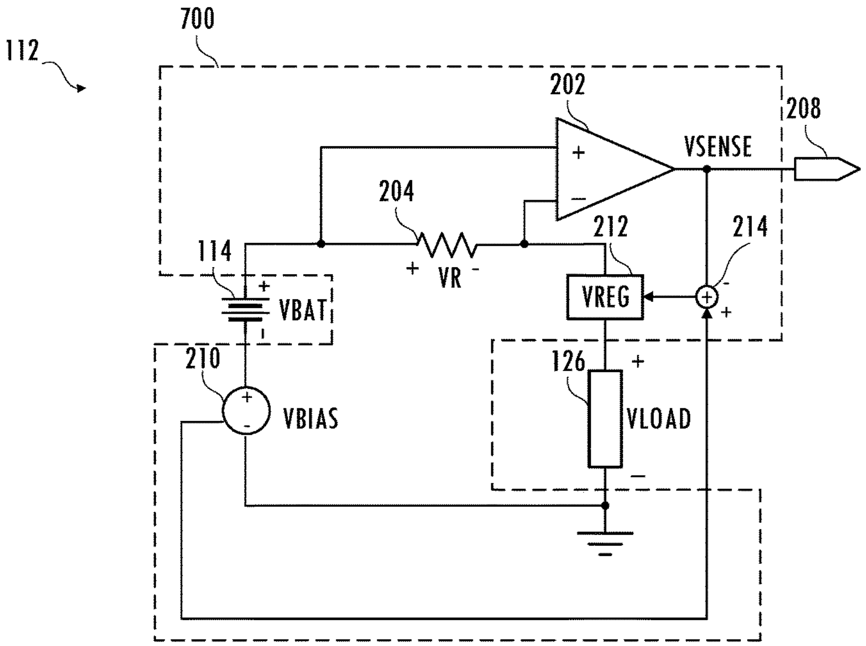
FIG. 5 illustrates a circuit diagram for exemplary portions of a development board including a voltage-compensated battery current sensing circuit for use in measuring power consumption of a battery-powered target device consistent with at least one embodiment of the invention.

Referring to FIG. 5, in at least one embodiment, sensing circuit 700 includes bias voltage source 210 in series with the negative terminal of battery 114 and voltage regulator 212 coupled between the negative terminal of sense resistor 204 and the positive power supply terminal of target device 126. In an embodiment, sense resistor 204 is a relatively large sense resistor (e.g., 50Ω) used to measure the current flowing from battery 114 into target device 126. Amplifier 202 senses the voltage drop across sense resistor 204 and provides an indication of the voltage difference to node 208, which is coupled to circuitry that performs an analog-to-digital conversion. If the feedback loop including amplifier 202 and voltage regulator 212 has a greater bandwidth than the load change rate, i.e., greater than the RC constant associated with the impedance seen by the first supply node (e.g., positive supply node) of the load toward the return path (e.g., ground), then the voltage difference values are periodic indicators of current flow information. Voltage regulator 212 forces the voltage across target device 126 to equal battery voltage $V_{BAT}$ of battery 114 according to a control signal generated by summing circuit 214, which subtracts sensed voltage $V_{SENSE}$ from bias voltage $V_{BIAS}$. Accordingly, target device 126 receives a voltage equal to the actual battery voltage of battery 114 during development and sensed voltage $V_{SENSE}$ can be used to observe power consumption of target device 126 under typical usage conditions in a target application.

Figure 6:
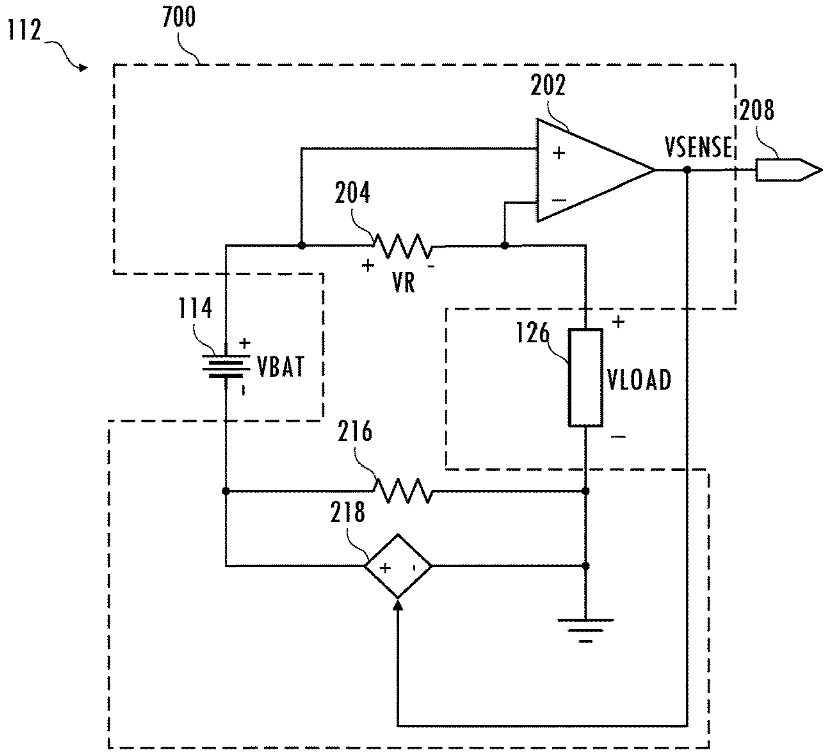
FIG. 6 illustrates a circuit diagram for exemplary portions of a development board including a current-balanced sensing circuit for use in measuring power consumption of a battery-powered target device consistent with at least one embodiment of the invention.

Referring to FIG. 6, in an embodiment, sensing circuit 700 includes voltage-controlled voltage regulator 218 coupled in parallel with compensation resistor 216. In an embodiment, compensation resistor 216 is coupled to the negative terminal of battery 114 to ground and has the same resistance as sense resistor 204 causing the current flowing through compensation resistor 216 to be equal to the load current through sense resistor 204. Thus, sensing circuit 700 provides a current-balanced battery current measurement. In other embodiments, compensation resistor 216 is excluded because it is not needed based on the amount of current that flows through voltage-controlled voltage regulator 218 and the impedance at the positive terminal of the voltage-controlled voltage regulator 218. Amplifier 202 provides an amplified version of the current flowing through sense resistor 204 that is fed to an analog-to-digital converter or other circuit coupled to node 208 for periodic measurement of the current flowing into target device 126. Since the current sensing mechanism causes a voltage drop across sense resistor 204, to compensate for the voltage drop across sense resistor 204 and to apply battery voltage $V_{BAT}$ across target device 126, bias voltage $V_{BIAS}$ is adjusted according to voltage $V_{SENSE}$. Accordingly, the voltage across target device 126 equals battery voltage $V_{BAT}$, making power consumption estimates under field conditions observable, thereby improving battery life estimates for target device 126.

Figure 7:
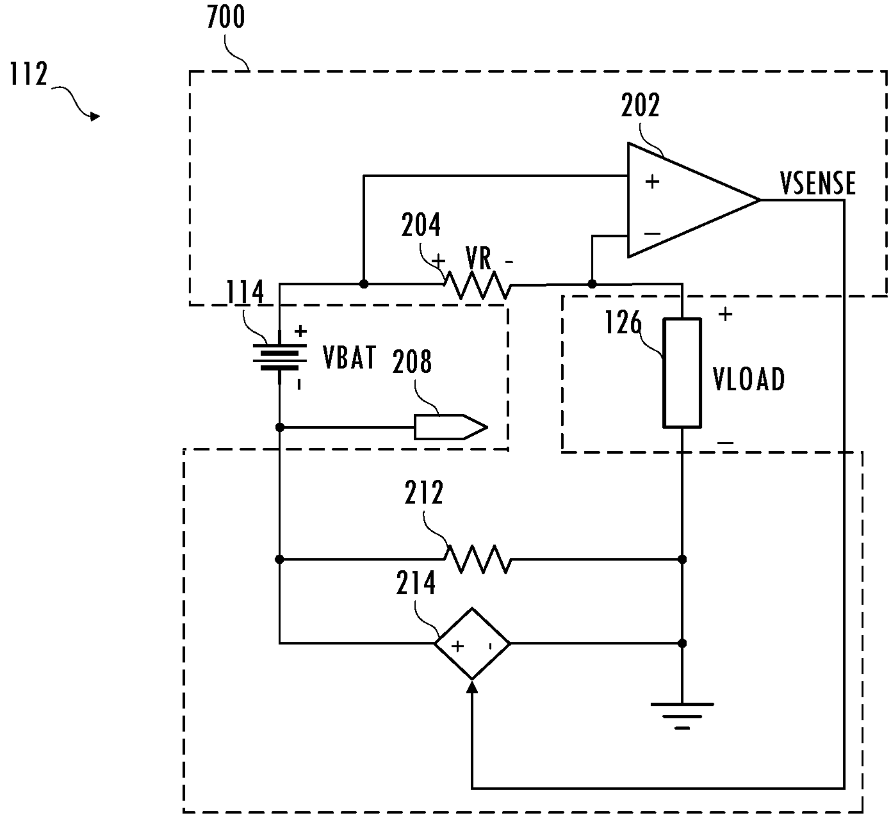
FIG. 7 illustrates a circuit diagram for exemplary portions of a development board including a current-balanced sensing circuit with low-side measurement for use in measuring power consumption of a battery-powered target device consistent with at least one embodiment of the invention.

In another embodiment of a current-balanced battery current measurement, the current drawn by target device 126 is sensed at the negative terminal of battery 114, as illustrated in FIG. 7. Node 208, which in an embodiment provides the sensed current signal to an analog-to-digital converter, is coupled to the negative terminal of battery 114. Sensing circuit 700 provides an indication of current consumed by target device 126 when target device 126 is powered by battery 114 at a voltage that is the same as the voltage the battery would supply in the field.

Figure 8:
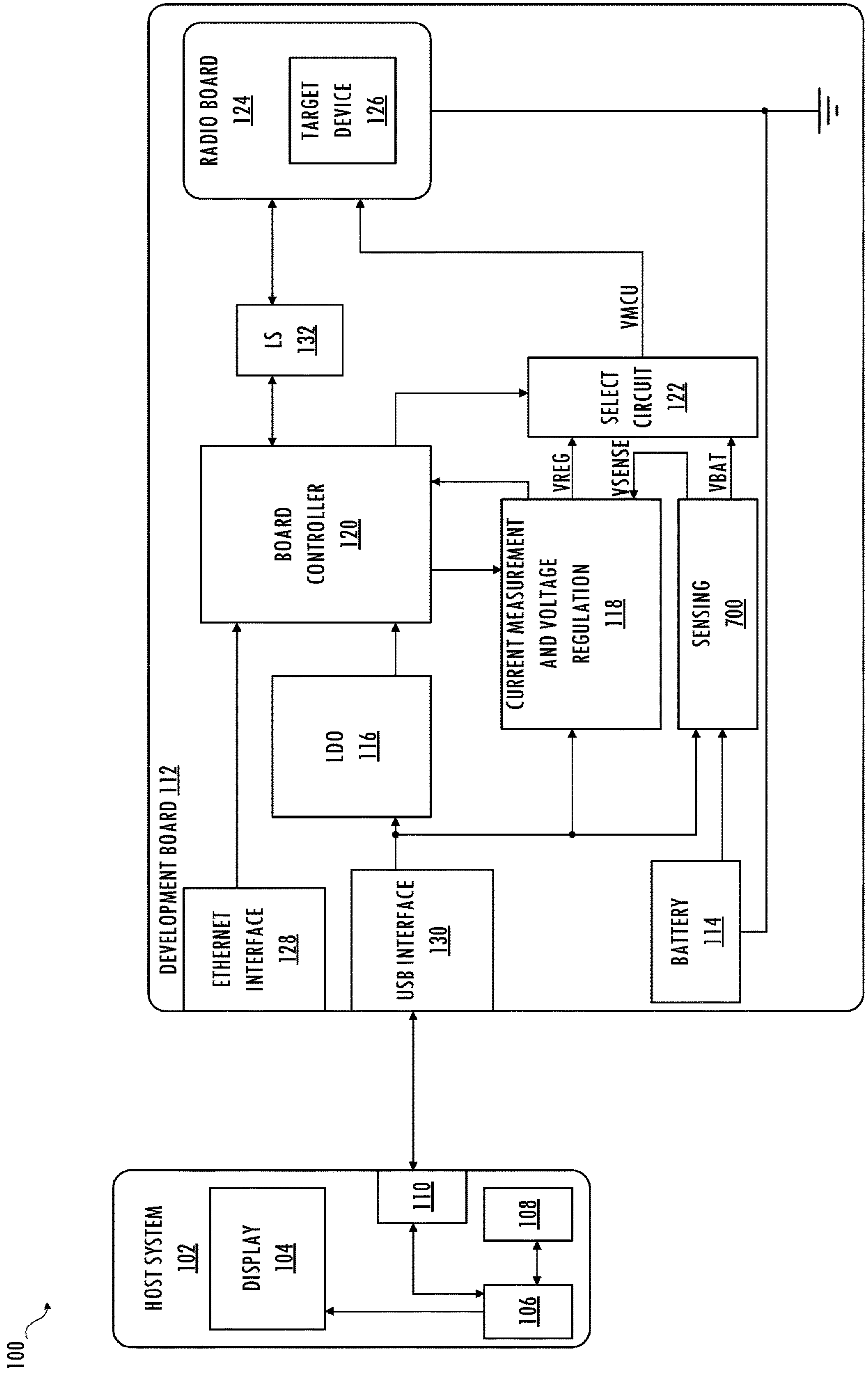
FIG. 8 illustrates a functional block diagram of an alternative embodiment of an exemplary development system for integrated circuit applications consistent with at least one embodiment of the invention.

Referring to FIG. 8, in at least one embodiment of development system 100, rather than supply the sensed signal to board controller 120, development board 112 reuses processing circuits of an energy monitor within current measurement and voltage regulation circuit 118 or other circuit of development board 112. Accordingly, when select circuit 122 provides the battery voltage as voltage $V_{MCU}$, sensing circuit 700 is coupled to an analog-to-digital converter circuit of an energy monitor circuit within current measurement and voltage regulation circuit 118 or other circuit (e.g., board controller 120) of development board 112 and current measurement and voltage regulation circuit 118 or other circuit of development board 112 provides a digital version of the sensed signal used by board controller 120.

Thus, development system techniques for providing power information for a target device configured for a target application when the target device receives power sourced from a battery instead of a line power source are described. The techniques enable use of existing energy profiler tools operating on a host system to evaluate power consumption of the target device under all modes of the target application. The techniques improve battery life estimates used to develop low power configurations of target device 126 and reduce or eliminate the need for users to purchase expensive power analysis tools or bench-top lab instruments which do not communicate with the board controller or debugger.

The description of the invention set forth herein is illustrative and is not intended to limit the scope of the invention as set forth in the following claims. The terms "first," "second," "third," and so forth, as used in the claims, unless otherwise clear by context, distinguish between different items in the claims and do not otherwise indicate or imply any order in time, location or quality. For example, "a first received signal," and "a second received signal," do not indicate or imply that the first received signal occurs in time before the second received signal. Variations and modifications of the embodiments disclosed herein may be made based on the description set forth herein, without departing from the scope of the invention as set forth in the following claims.

What is claimed is:

1. A method for developing a battery-powered device using a development system, the method comprising:

providing power to a load device from a battery using a first conductive node coupled to a first power supply terminal of the load device and a second conductive node coupled to a second power supply terminal of the load device; and providing an indicator of power consumption of the load device while the power is being provided to the load device using a voltage across the first power supply terminal and the second power supply terminal equal to a voltage equivalent to a battery voltage of the battery coupled to a third conductive node and a fourth conductive node.

2. The method as recited in claim 1 wherein the providing comprises:

providing a bias voltage to the fourth conductive node; and regulating a first voltage on the first conductive node according to the indicator and the bias voltage.

3. The method as recited in claim 1 wherein the providing comprises:

compensating for a voltage drop resulting from sensing the power consumption of the load device by regulating a voltage level on the fourth conductive node based on the indicator.

4. The method as recited in claim 1 wherein the indicator is based on a voltage level on the fourth conductive node.

5. The method as recited in claim 1 wherein the indicator is based on a voltage drop across a sensing element coupled to the first conductive node.

6. The method as recited in claim 1 further comprising:

providing the indicator to a host processing system; and displaying power information by the host processing system based on the indicator.

7. The method as recited in claim 6 further comprising:

programming the load device using the host processing system and a board controller responsive to power received from a first line power source.

8. The method as recited in claim 1 further comprising:

in a first mode of operating the development system, configuring the first conductive node and the second conductive node to receive the power from a first line power source; and in a second mode of operating the development system, configuring the first conductive node and the second conductive node to receive the power from the battery.

9. A development system comprising:

a printed circuit board comprising:

a sensing circuit coupled to a first conductive node, a second conductive node, a third conductive node, and a fourth conductive node and configured to provide an indication of power consumed by a load device, wherein the first conductive node is configured as a positive power supply terminal for the load device and the second conductive node is configured as a negative power supply terminal for the load device, and wherein the first conductive node and the second conductive node are configured to provide power to the load device from a battery and a voltage across the first conductive node and the second conductive node is equal to a voltage equivalent to a battery voltage of the battery.

10. The development system as recited in claim 9 wherein the sensing circuit comprises:

a resistor having a first resistance, a first terminal, and a second terminal, the resistor being coupled between the first conductive node and the third conductive node; and an amplifier circuit coupled to the first terminal and the second terminal.

11. The development system as recited in claim 10 wherein the indication corresponds to a load current flowing through the resistor.

12. The development system as recited in claim 10 wherein the sensing circuit further comprises:

a voltage regulator circuit coupled between the first conductive node and the second terminal; and a voltage bias circuit coupled between the second conductive node and the fourth conductive node, the voltage bias circuit being configured to provide a bias voltage to the fourth conductive node, wherein an output of the amplifier circuit is combined with the bias voltage to control the voltage regulator circuit.

13. The development system as recited in claim 10 wherein the sensing circuit further comprises:

a voltage regulator circuit, wherein the voltage regulator circuit is coupled to the second conductive node and the fourth conductive node, and wherein an output of the amplifier circuit controls the voltage regulator circuit.

14. The development system as recited in claim 13 wherein the sensing circuit further comprises:

a second resistor having a second resistance, wherein the second resistor is coupled to the second conductive node and the fourth conductive node, and wherein the voltage regulator circuit and the second resistor are coupled in parallel.

15. The development system as recited in claim 9 wherein in a first mode of operation the first conductive node and the second conductive node are configured to receive the power from a first line power source, and wherein in a second mode of operation the first conductive node and the second conductive node are configured to receive the power from the battery.

16. The development system as recited in claim 9 further comprising:

the load device;

a switch configured to selectively couple the load device to the battery in response to a control signal; and a board controller configured to program and debug the load device.

17. The development system as recited in claim 16 further comprising:

a host processing system coupled to the board controller and configured to display information associated with power consumption of the load device.

18. A development system comprising:

a circuit configured to provide power sourced from a battery to a load device and configured to provide an indication of a level of the power sourced from the battery to the load device using a voltage across the load device equal to a voltage equivalent to a battery voltage of the battery.

19. The development system as recited in claim 18 wherein the circuit comprises:

a sensing element, the sensing element having a first resistance and is coupled to a first battery terminal of the battery and a first load terminal of the load device; and an amplifier circuit, the amplifier circuit coupled to a first sensing terminal of the sensing element and a second sensing terminal of the sensing element.

20. The development system as recited in claim 19 wherein the circuit comprises:

an additional resistor, the additional resistor having a second resistance coupled to a second battery terminal of the battery and a second load terminal of the load device, the second resistance being equal to the first resistance; and a voltage regulator circuit, the voltage regulator circuit being coupled to the second battery terminal of the battery and the second load terminal of the load device, wherein the voltage regulator circuit and the additional resistor are coupled in parallel, and wherein an output of the amplifier circuit controls the voltage regulator circuit.

* * * * *